(12) United States Patent
Zhang et al.

(10) Patent No.: US 10,957,550 B2
(45) Date of Patent: Mar. 23, 2021

(54) SEMICONDUCTOR STRUCTURE AND FORMATION METHOD THEREOF

(71) Applicants: Semiconductor Manufacturing International (Beijing) Corporation, Beijing (CN); Semiconductor Manufacturing International (Shanghai) Corporation, Shanghai (CN)

(72) Inventors: Haiyang Zhang, Shanghai (CN); Erhu Zheng, Shanghai (CN)

(73) Assignees: Semiconductor Manufacturing (Beijing) International Corporation, Beijing (CN); Semconductor Manufacturing (Shanghai) International Corporation, Shanghai (CN)

( * ) Notice: Subject to any disclaimer, the term of this patent is extended or adjusted under 35 U.S.C. 154(b) by 0 days.

(21) Appl. No.: 16/537,072

(22) Filed: Aug. 9, 2019

(65) Prior Publication Data

US 2020/0279748 A1    Sep. 3, 2020

(30) Foreign Application Priority Data

Feb. 28, 2019  (CN) .......................... 201910152105.1

(51) Int. Cl.
| | |
|---|---|
| *H01L 21/308* | (2006.01) |
| *H01L 21/3065* | (2006.01) |
| *H01L 21/02* | (2006.01) |
| *H01L 29/06* | (2006.01) |
| *H01L 21/311* | (2006.01) |

(Continued)

(52) U.S. Cl.
CPC ...... *H01L 21/3086* (2013.01); *H01L 21/0223* (2013.01); *H01L 21/3065* (2013.01); *H01L 21/3081* (2013.01); *H01L 21/3088* (2013.01); *H01L 21/31116* (2013.01); *H01L 29/0657* (2013.01); *H01L 21/0234* (2013.01); *H01L 21/0271* (2013.01); *H01L 21/02118* (2013.01); *H01L 21/02164* (2013.01);
(Continued)

(58) Field of Classification Search
CPC ....................... H01L 21/3088; H01L 21/3086
See application file for complete search history.

(56) References Cited

U.S. PATENT DOCUMENTS 9,589,958 B1 * 3/2017 Kanakasabapathy ........................
                                                    H01L 21/823431
2019/0371915 A1 * 12/2019 Liao .................. H01L 29/66545

* cited by examiner

*Primary Examiner* — Farun Lu
(74) *Attorney, Agent, or Firm* — Brinks Gilson & Lione

(57) ABSTRACT

A semiconductor structure and a formation method thereof are provided. The formation method includes: providing a base, the base including a pattern dense region and a pattern isolated region; forming a plurality of separate hard mask layers on the base, where adjacent hard mask layers and the base define an opening, and an opening of the pattern isolated region is wider than an opening of the pattern dense region; forming a trimming layer at least on a side wall of the opening of the pattern isolated region, the trimming layer and the hard mask layer constituting a mask structure layer; and etching, using the mask structure layer as a mask, a portion of the thickness of the base exposed by the opening to form a plurality of target pattern layers protruding from the remaining base. Embodiments and implementations of the present disclosure are advantageous for improving a critical dimension uniformity of a target pattern layer in each region.

14 Claims, 5 Drawing Sheets

(51) Int. Cl.
*H01L 21/027* (2006.01)
*H01L 21/033* (2006.01)
(52) U.S. Cl.
CPC .. *H01L 21/02252* (2013.01); *H01L 21/02274* (2013.01); *H01L 21/02326* (2013.01); *H01L 21/033* (2013.01)

SEMICONDUCTOR STRUCTURE AND FORMATION METHOD THEREOF

RELATED APPLICATIONS

The present application claims priority to Chinese Patent Appln. No. 201910152105.1, filed Feb. 28, 2019, the entire disclosure of which is hereby incorporated by reference.

BACKGROUND

Technical Field

Embodiments and implementations of the present disclosure relate to the field of semiconductor manufacturing, and in particular, to a semiconductor structure and a formation method thereof.

Related Art

In a semiconductor integrated circuit manufacturing process, a series of procedures such as deposition, photolithography, etching, and planarization processes may be used to form a semiconductor structure. Photolithography and etching are main patterning means during semiconductor manufacturing.

The photolithography process generally includes: forming a photosensitive material layer (for example, a photoresist layer) on a base, and then transferring a pattern on a mask onto the photosensitive material layer by exposure, thereby forming a pattern in the photosensitive material layer to form a patterned mask layer, and defining a region to be etched. The etching process generally includes: etching, by using the mask layer as a mask, the region to be etched in a layer to be etched, so as to transfer a pattern in the mask layer into the layer to be etched, thereby forming a required structure in the layer to be etched.

With the continuous development of ultra-large integrated circuits, the critical dimension (CD) of semiconductor devices is decreasing, and the influence of the photolithography process on device performance is becoming more and more obvious. Therefore, in the case of smaller critical dimensions, how to improve the accuracy and stability of pattern transfer has become a research hot spot in the industry. Moreover, the difference between the pattern critical dimensions of a pattern dense region and a pattern isolated region affects the consistency of the electrical properties of the formed semiconductor devices.

SUMMARY

One problem to be addressed by embodiments and implementations of the present disclosure is to provide a semiconductor structure and a formation method thereof, which improve the uniformity of critical dimensions of a target pattern layer in each region.

In order to address the foregoing problem, embodiments and implementations of the present disclosure provide a method for forming a semiconductor structure. One form of the formation method includes: providing a base, the base including a pattern dense region and a pattern isolated region; forming a plurality of separate hard mask layers on the base, where adjacent hard mask layers and the base define an opening, and an opening of the pattern isolated region is wider than an opening of the pattern dense region; forming a trimming layer at least on a side wall of the opening of the pattern isolated region, the trimming layer and the hard mask layer constituting a mask structure layer; and etching, using the mask structure layer as a mask, a portion of the thickness of the base exposed by the opening to form a plurality of target pattern layers protruding from the remaining base.

The present disclosure additionally provides a semiconductor structure. In one form, the semiconductor structure includes: a base, including a pattern dense region and a pattern isolated region; hard mask layers, separately provided on the base, where adjacent hard mask layers and the base define an opening, and an opening of the pattern isolated region is wider than an opening of the pattern dense region; and a trimming layer, at least located on a side wall of the opening of the pattern isolated region, the trimming layer and the hard mask layer constituting a mask structure layer.

Compared with the prior art, a technical solution in some embodiments and implementations of the present disclosure have the following advantages:

In some embodiments and implementations of the present disclosure, the base is formed with a plurality of separate hard mask layers. After the adjacent hard mask layers and the base define an opening, a trimming layer at least on a side wall of the opening of the pattern isolated region is formed, where the trimming layer and the hard mask layer constitute a mask structure layer. As the opening is wider, the lateral etching of the base is more severe, and the formed target pattern layer is narrower. By means of the trimming layer, the width of the opening of the pattern isolated region is reduced, thereby reducing a width dimension difference between the openings of the pattern isolated region and the pattern dense region. In the step of subsequently etching a portion of the thickness of the base exposed by the opening, the trimming layer can compensate a difference of lateral etching quantities of the base corresponding to the pattern isolated region and the pattern dense region. Correspondingly, after forming a plurality of target pattern layers protruding from the remaining base, the critical dimension (CD) uniformity of the target pattern layer in each region is improved.

DETAILED DESCRIPTION

At present, critical dimension uniformity of a pattern dense region and a pattern isolated region is poor. A method for forming a semiconductor structure is now discussed to analyze a reason why the critical dimension uniformity of a pattern dense region and a pattern isolated region is poor.

Figure 1:
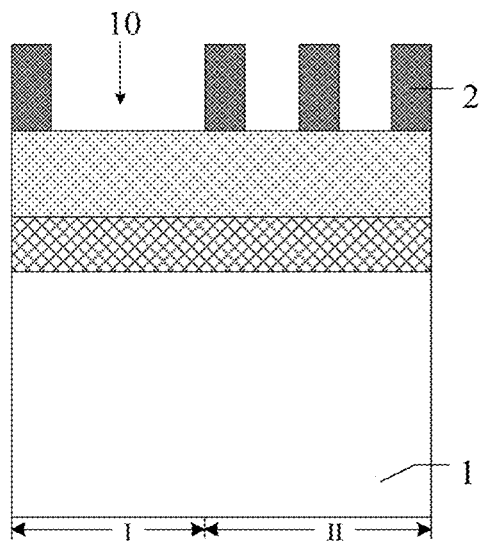
FIG. 1 and FIG. 2 schematically show structure diagrams corresponding to various steps in a method for forming a semiconductor structure.
Figure 2:
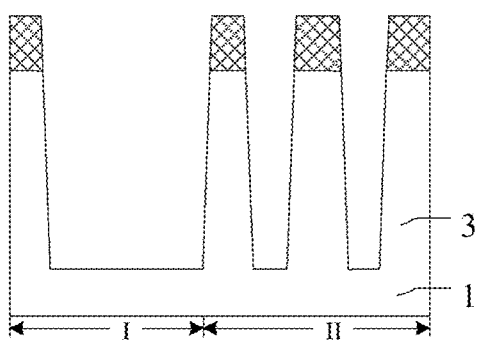

FIG. 1 and FIG. 2 schematically show structure diagrams corresponding to various steps in a method for forming a semiconductor structure.

Referring to FIG. 1, a base 1 is provided, the base 1 including a pattern dense region II and a pattern isolated region I.

The base 1 is formed with a plurality of separate hard mask layers 2. Adjacent hard mask layers 2 and the base 1 define an opening 10, where the opening 10 of the pattern isolated region I is wider than the opening 10 of the pattern dense region II.

Referring to FIG. 2, by using the mask structure layer 2 (as shown in FIG. 1) as a mask, a portion of the thickness of the base 1 exposed by the opening 10 is etched to form a plurality of target pattern layers 3 protruding from the remaining base 1.

As the opening 10 is wider, the lateral etching of the base 1 is more severe, and the formed target pattern layer 3 is narrower. Therefore, in the formation method, a width dimension difference between the target pattern layers 3 formed on the pattern dense region II and the pattern isolated region I is large. Specifically, compared with the target pattern layer 3 of the pattern dense region II, the target pattern layer 3 of the pattern isolated region I is narrower, thereby reducing the critical dimension uniformity of the target pattern layer 3 in each region.

Figure 3:
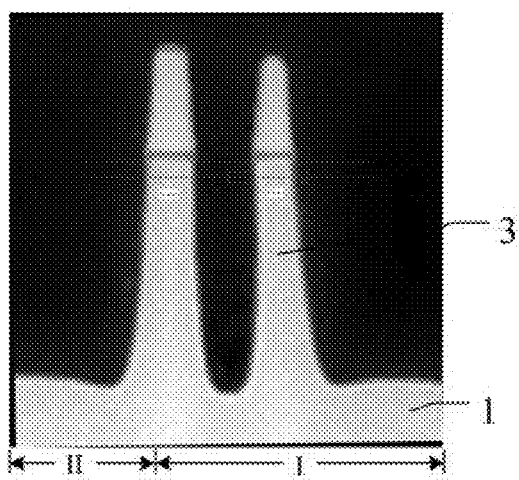
FIG. 3 shows an electron microscope scan of a semiconductor structure.

Referring to FIG. 3, FIG. 3 shows an electron microscope scan of a semiconductor structure. As can be seen from the figure, the target pattern layer 3 of the pattern isolated region I is narrower than the target pattern layer 3 of the pattern dense region II, and the critical dimension uniformity of the target pattern layer 3 in each region is poor.

To address the foregoing technical problem, embodiments and implementations of the present disclosure provide a method for forming a semiconductor structure. One form of the method includes: providing a base, the base including a pattern dense region and a pattern isolated region; forming a plurality of separate hard mask layers on the base, the adjacent hard mask layers and the base defining an opening, and the opening of the pattern isolated region being wider than the opening of the pattern dense region; forming a trimming layer at least on a side wall of the opening of the pattern isolated region, the trimming layer and the hard mask layer constituting a mask structure layer; and etching, using the mask structure layer as a mask, a portion of the thickness of the base exposed by the opening to form a plurality of target pattern layers protruding from the remaining base.

The base is formed with a plurality of separate hard mask layers. After adjacent hard mask layers and the base define an opening, a trimming layer is formed at least on a side wall of the opening of the pattern isolated region, where the trimming layer and the hard mask layer constitute a mask structure layer. As the opening is wider, the lateral etching of the base is more severe, and the formed target pattern layer is narrower. By means of the trimming layer, the width of the opening of the pattern isolated region is reduced, thus reducing a width dimension difference between the openings of the pattern isolated region and the pattern dense region. In the step of subsequently etching a portion of the thickness of the base exposed by the opening, the trimming layer can compensate a difference of lateral etching quantities of the base corresponding to the pattern isolated region and the pattern dense region. Correspondingly, after forming a plurality of target pattern layers protruding from the remaining base, the critical dimension uniformity of the target pattern layer in each region is improved.

In order to make the foregoing objectives, features, and advantages of embodiments and implementations of the present disclosure more apparent and understandable, specific embodiments and implementations of the present disclosure will be described in detail below with reference to the accompanying drawings.

FIG. 4 to FIG. 9 schematically show structure diagrams corresponding to various steps in one form of a method for forming a semiconductor structure.

Figure 4:
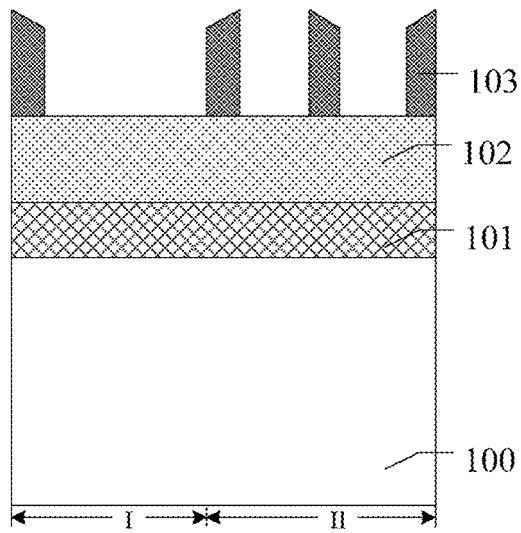
FIG. 4 to FIG. 9 schematically show structure diagrams corresponding to various steps in a method for forming a semiconductor structure.

Referring to FIG. 4, a base 100 is provided, the base 100 including a pattern dense region II and a pattern isolated region I.

The base 100 is used to provide a process platform for subsequent process procedures, and the base 100 is patterned subsequently to form a protruding target pattern layer on the remaining base 100.

In some implementations, the base 100 includes a pattern dense region II and a pattern isolated region I, and after forming a plurality of target pattern layers protruding from the remaining base 100 subsequently, the number of target pattern layers of the pattern dense region II is greater than the number of target pattern layers of the pattern isolated region I on the remaining base 100 per unit region.

In some implementations, the base 100 is used to form a substrate and a fin protruding from the substrate.

In some implementations, the material of the base 100 is silicon. In some other implementations, the material of the base may also be other materials such as germanium, silicon germanide, silicon carbide, gallium arsenide or indium gallide, and the base may also be other types of bases such as a silicon base on an insulator or a germanium base on an insulator. In still other implementations, the base may further include a first semiconductor layer and a second semiconductor layer epitaxially grown on the first semiconductor layer, the first semiconductor layer being used to provide a process basis for subsequently forming a substrate, and the second semiconductor layer being used to provide a process basis for subsequently forming a fin. In other implementations, the base may also be another functional layer to be etched, such as a gate material layer.

In some implementations, the base 100 is further formed with a polishing stop material layer 101 and a pattern transfer material layer 102 on the polishing stop material layer 101.

The polishing stop material layer 101 is used to subsequently form a polishing stop layer.

In some implementations, the base 100 is used to form a substrate and a fin protruding from the substrate. After subsequently forming the substrate and the fin, the method generally further includes a step of forming an isolation material layer on the substrate exposed by the fin. The polishing stop layer is used to define a stop position of planarization in the step of planarization for forming the isolation material layer, so as to improve the top height consistency of the isolation material layer and the loss of the fin by the planarization.

The polishing stop material layer 101 is further used to protect the top of the base 100 during the subsequent process procedure.

In some implementations, the material of the polishing stop material layer 101 is silicon nitride. The hardness and density of the silicon nitride material are both large, so that the effect of the polishing stop layer for defining the stop position of planarization can be ensured.

The pattern transfer material layer 102 is a material to be patterned, and after a mask structure layer is subsequently formed on the base 100, a pattern in the mask structure layer is transferred into the pattern transfer material layer 102 to form a pattern transfer layer, thereby providing a process basis for subsequently patterning the base 100.

In some implementations, the material of the pattern transfer material layer 102 is silicon oxide.

Figure 5:
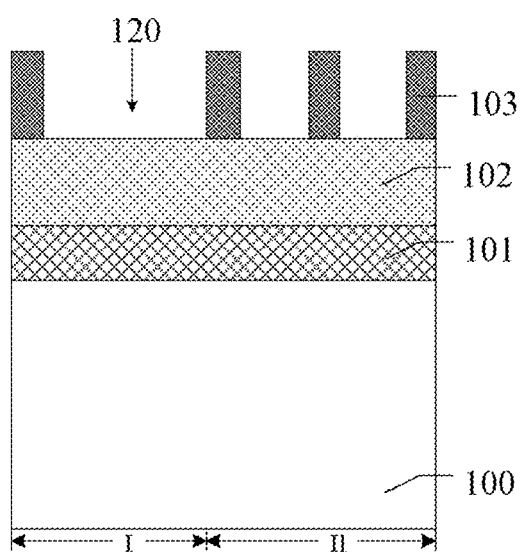

Referring to FIG. 4 and FIG. 5, the base 100 is formed with a plurality of separate hard mask layers 103, the adjacent hard mask layers 103 and the base 100 defining an opening 120 (as shown in FIG. 5), and the opening 120 of the pattern isolated region I being wider than the opening 120 of the pattern dense region II.

The hard mask layer 103 is used as a portion of a mask for subsequently patterning the base 100. The hard mask layer 103 is further used to provide a process platform for subsequently forming a trimming layer on a side wall of the opening 120. Specifically, the hard mask layer 103 is formed on the pattern transfer material layer 102.

In order to enable the hard mask layer 103 to function as a mask in the step of subsequently patterning the base 100, the material of the hard mask layer 103 is material having a larger etching selection ratio than the material of the base 100. In some implementations, the material of the hard mask layer 103 is silicon nitride.

In other implementations, the material of the hard mask layer may be another material having a larger etching selection ratio than the material of the base, depending on the material of the base and actual process requirements.

The hard mask layers 103 are separately provided on the base 100. Specifically, the hard mask layers 103 of various regions have the same width, the number of the hard mask layers 103 on the pattern isolated region I is less than that of the hard mask layers 103 on the pattern dense region II on the base 100 per unit region, and a space between the adjacent hard mask layers 103 on the pattern isolated region I is larger than a space between the adjacent hard mask layers 103 on the pattern dense region II. Therefore, the opening 120 of the pattern isolated region I is wider than the opening 120 of the pattern dense region II.

In some implementations, a hard mask layer 103 is formed by means of a self-aligned double-patterning (SADP) process. The step of forming the hard mask layer 103 includes: forming a core layer (not shown) on the base 100, forming a hard mask material layer (not shown) on the top and side wall of the core layer and the top of the base 100 exposed by the core layer, removing the hard mask material layer on the top of the core layer and the top of the base 100, and retaining the remaining hard mask material layer on the side wall of the core layer as the hard mask layer 103. After the hard mask layer 103 is formed, the method further includes: removing the core layer.

As shown in FIG. 4, it is to be noted that in the steps of removing the hard mask material layers on the top of the core layer and the top of the base 100 and removing the core layer, the loss may be produced to the top of the remaining hard mask material layer on the side wall of the core layer. Therefore, after the hard mask layer 103 is formed, the flatness of the top of the hard mask layer 103 is low. Specifically, in some implementations, the top of the hard mask layer 103 is a slope.

Therefore, in conjunction with FIG. 5, in some implementations, after the hard mask layer 103 is formed, the method further includes: planarizing the top of the hard mask layer 103.

By planarizing the top of the hard mask layer 103, the top flatness of the hard mask layer 103 is improved, so that the top of the hard mask layer 103 can be parallel to the surface of the base 100. Correspondingly, it is advantageous to improve the formation quality of a subsequent trimming layer and to improve the problem of different etch species collection angles, thereby improving the process effect of subsequently patterning the base 100.

In some implementations, the step of planarizing the top of the hard mask layer 103 includes: forming a planarization layer (not shown) on the pattern transfer material layer 102 exposed by the hard mask layer 103, the planarization layer exposing at least the slope; and removing the hard mask layer 103 higher than the top of the planarization layer. After removing the hard mask layer 103 higher than the top of the planarization layer, the method further includes: removing the planarization layer.

The planarization layer is used to protect the base 100 exposed by the hard mask layer 103, and the planarization layer is also used to define the removal amount of the hard mask layer 103.

In some implementations, the material of the planarization layer is a spin on carbon (SOC) material, which is advantageous for reducing the process difficulty of forming the planarization layer and subsequently removing the planarization layer, and reducing the influence of the planarization layer on the semiconductor structure. In other implementations, the material of the planarization layer may also be an organic dielectric layer (ODL) material, a bottom anti-reflective coating (BARC) material, and a deep UV light absorbing oxide (DUO) material or a dielectric anti-reflective coating (DARC) material.

In some implementations, the planarization layer is formed by a spin-on process. The spin-on process is easy to operate, and advantageous for improving process compatibility and production capacity.

In some implementations, the hard mask layer 103 higher than the top of the planarization layer is removed by a plasma etching process. The etching selectivity of the plasma etching process is high, which is advantageous for reducing the influence on other film structures during the process of removing the hard mask layer 103 higher than the top of the planarization layer, and moreover, the plasma etching process is advantageous for precisely controlling the removal amount of the hard mask layer 103.

In some implementations, after the hard mask layer 103 higher than the top of the planarization layer is removed, the planarization layer is removed by an ashing process.

Figure 6:
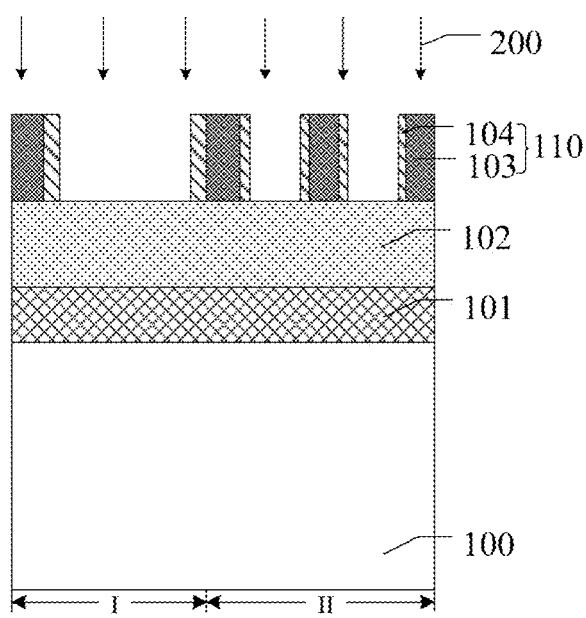

Referring to FIG. 6, a trimming layer 104 at least on a side wall of the opening 120 of the pattern isolated region I is formed, the trimming layer 104 and the hard mask layer 103 constituting a mask structure layer 110.

The mask structure layer 110 is used as an etching mask for subsequently patterning the base 100.

As the opening 120 is wider, the lateral etching of the base 100 is more severe, and the formed target pattern layer is narrower. By means of the trimming layer 104, the width of the opening 120 of the pattern isolated region I is reduced, thus reducing a width dimension difference between the openings 120 of the pattern isolated region I and the pattern dense region II. In the step of subsequently etching a portion of the thickness of the base 100 exposed by the opening 120, the trimming layer 104 can compensate a difference of lateral etching quantities of the base 100 corresponding to the pattern isolated region I and the pattern dense region II. Correspondingly, after subsequently forming a plurality of target pattern layers protruding from the remaining base 100, the critical dimension uniformity of the target pattern layer in each region is improved.

In some implementations, the trimming layers 104 are located on the side walls of the openings 120 of the pattern isolated region I and the pattern dense region II, and the thickness of the trimming layer 104 of the pattern isolated region I is greater than that of the trimming layer 104 of the pattern dense region II in a direction perpendicular to the side walls of the openings 120.

In some implementations, a dimensional difference between the openings 120 of the pattern isolated region I and the pattern dense region II is small. In the step of subsequently patterning the base 100, a lateral etching quantity difference of the base 100 corresponding to the pattern isolated region I and the pattern dense region II is also small. Therefore, the trimming layers 104 are formed on the side walls of the openings 120 of the pattern isolated region I and the pattern dense region II, which is advantageous for preventing the trimming layers 104 from excessively compensating the subsequent lateral etching quantity difference of the base 100 corresponding to the pattern isolated region I and the pattern dense region II.

Specifically, since the trimming layers 104 of the pattern isolated region I and the pattern dense region II have different thickness. In the step of subsequently patterning the base 100, a thickness difference between the trimming layers 104 of the pattern isolated region I and the pattern dense region II is used to compensate the lateral etching quantity difference of the base 100 corresponding to the pattern isolated region I and the pattern dense region II, and the width dimension uniformity of a target pattern layer can be improved correspondingly.

Moreover, the trimming layers 104 of the pattern isolated region I and the pattern dense region II are usually formed in the same step. By forming the trimming layers 104 on the side walls of the openings 120 of the pattern isolated region I and the pattern dense region II, the width dimension uniformity of a target pattern layer is improved while the step of removing the trimming layer 104 of the pattern dense region II is removed correspondingly, thereby simplifying the process steps.

A thickness difference between the trimming layer 104 of the pattern isolated region I and the trimming layer 104 of the pattern dense region II should not be too small, and should not be too large. If the thickness difference is too small, the effect of the trimming layers 104 for compensating the lateral etching quantity difference of the base 100 corresponding to the pattern isolated region I and the pattern dense region II is not significant, and correspondingly, it is prone to reduce the effect of the trimming layers 104 for improving the critical dimension uniformity of the target pattern layer in each region. If the thickness difference is too large, the compensation excess may easily occur, that is, the width of the target pattern layer of the pattern isolated region I may be too large subsequently, which may also reduce the width dimension uniformity of the target pattern layer in each region. To this end, in some implementations, the thickness difference between the trimming layer 104 of the pattern isolated region I and the trimming layer 104 of the pattern dense region II is in a range of 0.5 nm to 3 nm.

It is to be noted that in the actual manufacturing process, according to the difference between width dimensions of the openings 120 of the pattern isolated region I and the pattern dense region II, and actual process conditions (for example, setting of etching process parameters), the thickness difference between the trimming layer 104 of the pattern isolated region I and the trimming layer 104 of the pattern dense region II may be reasonably adjusted.

In other implementations, the trimming layer may also be located only on the side wall of the opening of the pattern isolated region, depending on the width dimension difference of the opening of each region, and actual process conditions. For example, when the dimension difference of the openings of the pattern isolated region and the pattern dense region is large, the trimming layer may be located only on the side wall of the opening of the pattern isolated region, and can subsequently compensate the lateral etching quantity difference of the base corresponding to the pattern isolated region.

In some implementations, the step of forming the trimming layer 104 includes: performing at least one pre-etch pretreatment 200, and forming trimming layers 104 on the side walls of the openings 120 of the pattern isolated region I and the pattern dense region II.

The step of pre-etch pretreatment 200 includes: performing plasma pretreatment, forming a trimming material layer (not shown) on the bottom and side wall of the opening 120 and the top of the hard mask layer 103, removing the trimming material layer on the bottom of the opening 120 and the top of the hard mask layer 103, and retaining the remaining trimming material layer on the side wall of the opening 120 as the trimming layer 104, the thickness of the remaining trimming material layer on the side wall of the opening 120 of the pattern isolated region I being greater than that of the remaining trimming material layer on the side wall of the opening 120 of the pattern dense region II in a direction perpendicular to the side wall of the opening 120.

Specifically, reaction gas introduced into a plasma pretreatment chamber includes $SiCl_4$, $CH_4$, $CH_3F$ or $CH_2F_2$ gas, and reaction products generated by the reaction gas are attached to the bottom and side wall of the opening 120 and the top of the hard mask layer 103 to form a trimming material layer.

In some implementations, the reaction gas for the plasma pretreatment is $SiCl_4$, and correspondingly, the material of the trimming layer 104 is a silicon-containing oxide layer. The silicon-containing oxide layer is a mask material (for example, silicon oxide, silicon oxynitride, etc.) commonly used in a semiconductor process, which is advantageous for improving process compatibility, and process stability and process effects of subsequent patterning processes, and is prone to remove silicon-containing oxide layers. Specifically, the material of the trimming layer 104 is silicon oxide. The silicon oxide is a commonly used material for the semiconductor process, which is advantageous for improving the process compatibility and reducing the process cost.

In other implementations, when the reaction gas for the plasma pretreatment is $CH_4$, $CH_3F$ or $CH_2F_2$ gas, the material of the trimming layer is a carbon-containing polymer correspondingly.

The number of the hard mask layers 103 of the pattern dense region II is greater than that of the hard mask layers 103 of the pattern isolated region I over a region of the same size. Therefore, compared with the pattern isolated region I, the total region of the hard mask layers 103 exposed by the side wall of the opening 120 on the pattern dense region II is larger. In the step of plasma pretreatment, in the case of the same amount of the reaction gas over a region of the same size, compared with the pattern isolated region I, the quantity of reaction products attached to the side wall of the opening 120 of the pattern isolated region I per unit region is smaller. Therefore, the thickness of the trimming material layer formed on the side wall of the hard mask layer 103 of the pattern dense region II is smaller, and the thickness of the trimming layer 104 of the pattern isolated region I is correspondingly greater than that of the trimming layer 104 of the pattern dense region II.

A gas flow rate of the plasma pretreatment should not be too small, and should not be too large. If the gas flow rate is too small, it is prone to reduce the reaction rate, thereby reducing the process manufacturing efficiency. If the gas flow rate is too large, it is prone to reduce the process stability, increase the process risk, and excessively thicken the trimming layer 104 of the pattern isolated region I, thereby making the thickness difference between the trimming layers 104 of the pattern isolated region I and the pattern dense region II difficult to meet process requirements. To this end, in some implementations, the reaction gas for the plasma pretreatment is $SiCl_4$, having a flow rate of 5 sccm to 500 sccm.

Moreover, in order to ensure that the plasma density of the plasma pretreatment can meet process requirements, in some implementations, a source power of the plasma pretreatment is in a range of 100 W to 1,000 W.

In addition, a process pressure of the plasma pretreatment is in a range of 5 mtorr to 200 mtorr, so that it can be matched with process parameters such as the gas flow rate and the source power of the plasma pretreatment, thereby improving the process manufacturing efficiency and reducing side effects.

In some implementations, the trimming material layer on the bottom of the opening 120 and the top of the hard mask layer 103 is removed by a plasma etching process.

The plasma etching process has anisotropic etching characteristics, thereby ensuring that the trimming material layer on the bottom of the opening 120 and the top of the hard mask layer 103 is removed while the consumption of the trimming material layer on the side wall of the hard mask layer 103 is reduced, so that the thickness difference between the trimming layers 104 on the side walls of the openings 120 of the pattern isolated region I and the pattern dense region II can meet process requirements.

In some implementations, etching gas of the plasma etching process includes $CF_4$, $CH_3F$ and $NF_3$.

A gas flow rate of the etching gas of the plasma etching process should not be too small, and should not be too large. If the gas flow rate is too small, it is prone to reduce the etching rate, and it is prone to cause that the trimming material layer on the bottom of the opening 120 and the top of the hard mask layer 103 cannot be completely removed. If the gas flow rate is too large, it is prone to increase the process risk, reduce the stability and uniformity of the etching process, and laterally etch the trimming material layer on the side wall of the opening 120 to make the thickness difference between the trimming layers 104 of the pattern isolated region I and the pattern dense region II difficult to meet process requirements. To this end, in some implementations, the etching gas of the plasma etching process includes $CH_4$, $CH_3F$ and $NF_3$, where $CH_4$ has a gas flow rate of 5 sccm to 500 sccm, $CH_3F$ has a gas flow rate of 5 sccm to 500 sccm, and $NF_3$ has a gas flow rate of 5 sccm to 500 sccm.

In order to ensure that the plasma density of the plasma pretreatment is within a preset range, in some implementations, a source power of the plasma etching process is in a range of 100 W to 1,000 W.

A bias power of the plasma etching process should not be too small, and should not be too large. If the bias power of the plasma etching process is too small, it is prone to reduce the anisotropy of the etching process, thereby excessively consuming the trimming material layer on the side wall of the opening 120 by the plasma etching process, so that the thickness of the trimming layer 104 is difficult to meet process requirements. If the bias power of the plasma etching process is too large, it is prone to increase the probability of loss produced to other film structures by the plasma etching process. To this end, in some implementations, the bias power of the plasma etching process is in a range of 50 W to 500 W.

In addition, a process pressure of the plasma etching process is in a range of 5 mtorr to 200 mtorr, so that it can be matched with process parameters such as the gas flow rate and the source power of the plasma etching process, thereby improving the process manufacturing efficiency and reducing side effects.

In an actual process, the thickness difference between the trimming layers 104 of the pattern isolated region I and the pattern dense region II may also be precisely controlled by adjusting the number of pre-etch pretreatments 200, so as to improve the compensation effect of the trimming layers 104 on the subsequent lateral etching quantity difference of the base 100 corresponding to each region, thus improving the width dimension uniformity of a target pattern layer in each region subsequently.

It is to be noted that in some implementations, by retaining the trimming layer 104 on the side wall of the opening 120 of the pattern dense region II, a mask can be omitted in the step of forming the trimming layer 104, which is advantageous for reducing the process cost.

It is also to be noted that in other implementations, the trimming layer may also be located only on the side wall of the opening of the pattern isolated region. Correspondingly, after forming the trimming layer, the method further includes: removing the trimming layer of the pattern dense region. Or, before forming the trimming layer, a protective layer covering the pattern dense region is formed. In the step of forming the trimming layer, the trimming layer is only formed on the side wall of the opening of the pattern isolated region. After forming the trimming layer, the protective layer is removed.

Figure 7:
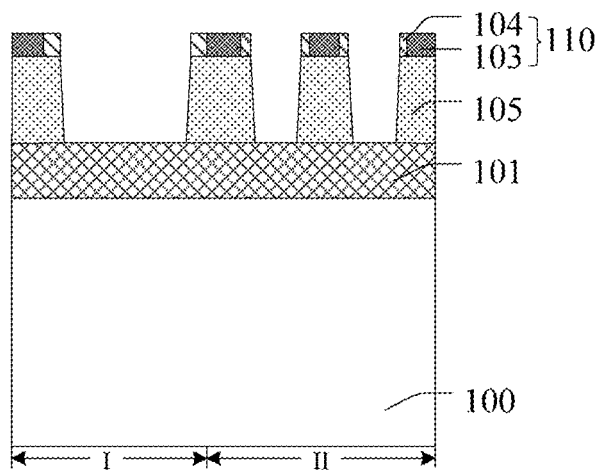
Figure 8:
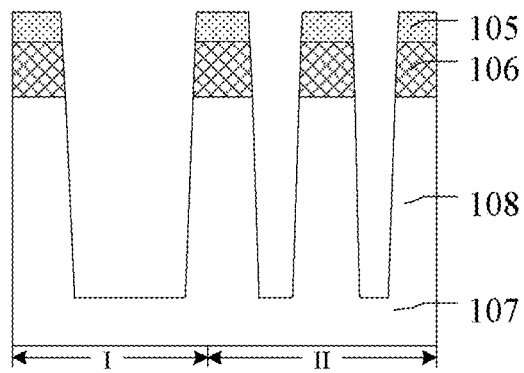
Figure 9:
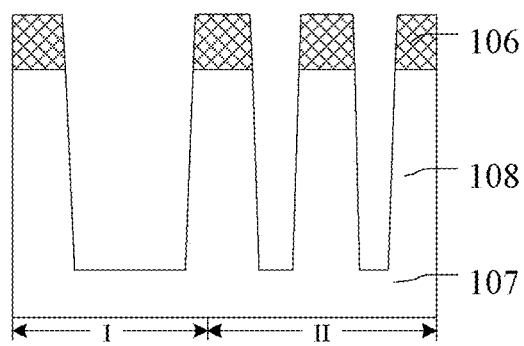

Referring to FIG. 7 to FIG. 9, by using the mask structure layer 110 as a mask, a portion of the thickness of the base 100 exposed by the opening 120 is etched (as shown in FIG. 7) to form a plurality of target pattern layers (not shown) protruding from the remaining base 100.

As the opening is wider, the lateral etching of the base is more severe, and the formed target pattern layer is narrower. By means of the trimming layer 104, the width of the opening 120 of the pattern isolated region I is reduced, thereby reducing a width dimension difference between the openings 120 of the pattern isolated region I and the pattern dense region II. Therefore, in the step of etching a portion of the thickness of the base 100 exposed by the opening 120, the trimming layer 104 can compensate a difference of lateral etching quantities of the base 100 corresponding to the pattern isolated region I and the pattern dense region II. Correspondingly, the critical dimension uniformity of the target pattern layer in each region is improved.

In some implementations, after the portion of the thickness of the base 100 exposed by the opening 120 is etched, the remaining base 100 is used as a substrate 107 (as shown in FIG. 8), and the target pattern layer is a fin 108 (as shown in FIG. 8). Correspondingly, the width dimension uniformity of the fin 108 is improved by the trimming layer 104.

Specifically, in some implementations, the step of etching, by using the mask structure layer 110 as a mask, a portion of the thickness of the base 100 exposed by the opening 120 includes: As shown in FIG. 7, the pattern transfer material layer 102 exposed by the opening 120 is etched using the mask structure layer 110 as a mask, and the remaining pattern transfer material layer 102 is used as a pattern transfer layer 105.

The pattern transfer layer 105 is formed by first transferring a pattern in the mask structure layer 110 into the pattern transfer material layer 102, and the base 100 can be subsequently etched by using the pattern transfer layer 105 as a mask. Compared with the scheme of directly etching the base by using the mask structure layer as a mask, the pattern transfer layer 105 has a single layer structure, and the mask transfer layer 105 has a good mask effect, which is advantageous for improving the process stability and process effect of the patterning process, thereby improving the pattern precision of the target pattern layer, so that the shape of the target pattern layer meets process requirements. For example, the line edge roughness (LER) and the line width roughness (LWR) are improved.

In some implementations, after forming the pattern transfer layer 105, the remaining mask structure layer 110 remains on the pattern transfer layer 105. Therefore, the formation method further includes: after forming the pattern transfer layer 105, removing the remaining mask structure layer 110.

Referring to FIG. 8, by using the pattern transfer layer 105 as a mask, a portion of the thickness of the base 100 is etched (as shown in FIG. 7) to form a plurality of target pattern layers protruding from the remaining base 100.

In some implementations, a polishing stop material layer 101 (as shown in FIG. 7) is formed on the base 100. Therefore, before etching the portion of the thickness of the base 100, the polishing stop material layer 101 is further etched to form a polishing stop layer 106.

In some implementations, the polishing stop material layer 101 and the portion of the thickness of the base 100 are etched by a plasma etching process. The plasma etching process has the characteristics of anisotropic etching, and has better profile controllability and etching selectivity, which is advantageous for improving the transfer precision of a pattern, so that the profile and shape of the target pattern layer meet process requirements.

In some implementations, the plasma etching process uses a square wave pulse type bias voltage. The square wave pulse type bias voltage can intermittently provide higher kinetic energy for plasma, which is advantageous for improving the process effect of a patterning process. Specifically, when the bias voltage is in a high level mode, the kinetic energy of the plasma is larger, and the anisotropic etching capability is better, which is advantageous for improving the steepness of the side wall of the target pattern layer, thereby obtaining a better target pattern layer shape. When the bias voltage is in a low level mode, a by-product (for example, a polymer) generated during the etching process may be extracted from a reaction chamber, thereby reducing the influence of the by-product on the etching process, and improving the uniformity of the etching rate.

It is to be noted that in some implementations, after the target pattern layer is formed, the pattern transfer layer 105 remains on the top of the target pattern layer.

Therefore, after forming the target pattern layer in conjunction with FIG. 9, the method further includes: removing the remaining pattern transfer layer 105.

In some implementations, the remaining pattern transfer layer 105 is removed by planarization. Specifically, the planarization is performed by using a chemical mechanical polishing process. The chemical mechanical polishing process is low in cost and simple.

In some implementations, a polishing stop layer 106 is formed on the base 100. Therefore, the top of the polishing stop layer 106 is a stop position, and the remaining pattern transfer layer 105 is removed by polishing, which is advantageous for improving the height consistency of the target pattern layer. Specifically, it is advantageous for improving the height consistency of the fin 108.

Figure 10:
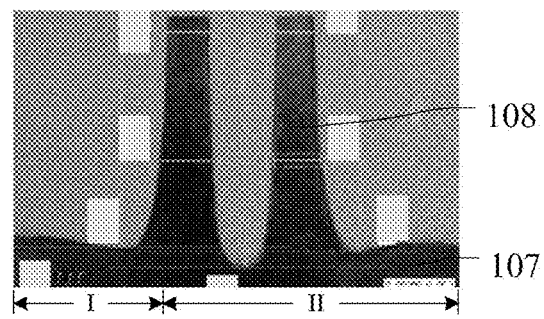
FIG. 10 shows an electron microscope scan of a semiconductor structure.

In conjunction with FIG. 10, it shows an electron microscope scan of a semiconductor structure in FIG. 9. As can be seen from the figure, the width dimension uniformity of the fins 108 of each region is good.

Figure 11:
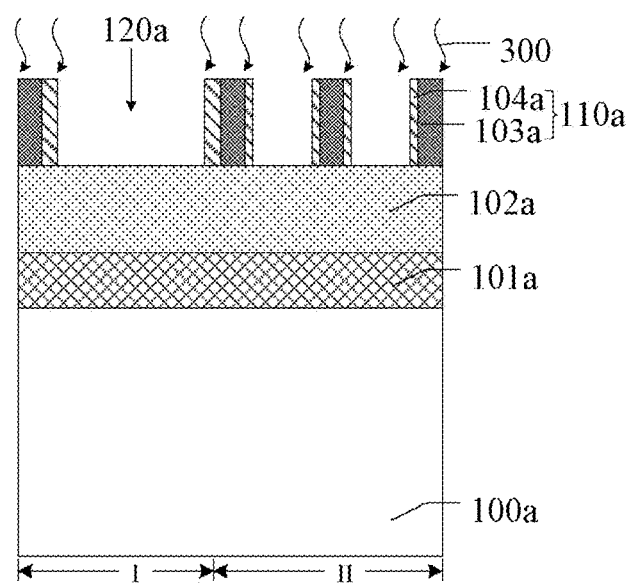
FIG. 11 schematically shows a structure diagram corresponding to each step in a method for forming a semiconductor structure.

FIG. 11 schematically shows a structure diagram corresponding to each step in a formation method of a semiconductor structure according to another embodiment of the present disclosure.

The same points of some implementations are the same as those of the foregoing embodiment, and details are not described herein again. Some implementations is different from the foregoing embodiment in that the methods of forming the trimming layer are different.

Referring to FIG. 11, a trimming layer 104a at least on a side wall of the opening 120a of the pattern isolated region I is formed, the trimming layer 104a and the hard mask layer 103a constituting a mask structure layer 110a.

In some implementations, the trimming layers 104a are located on the side walls of the openings 120a of the pattern isolated region I and the pattern dense region II, and the thickness of the trimming layer 104a of the pattern isolated region I is greater than that of the trimming layer 104a of the pattern dense region II in a direction perpendicular to the side walls of the openings 120a.

In some implementations, the step of forming the trimming layer 104a includes: performing oxidation treatment 300 on the hard mask layer 103a exposed by the side walls of the openings 120a of the pattern isolated region I and the pattern dense region II, consuming a portion of the thickness of the hard mask layer 103a, and forming the trimming layer 104a on the side wall of the remaining hard mask layer 103a, the thickness of the trimming layer 104a of the pattern isolated region I being greater than that of the trimming layer 104a of the pattern dense region II in a direction perpendicular to the side wall of the opening 120a.

In the process of performing the oxidation treatment 300 on the hard mask layer 103a exposed by the side wall of the opening 120a, as the hard mask layer 103a is more oxidized, the formed trimming layer 104a is thicker. Moreover, the number of the hard mask layers 103a of the pattern dense region II is greater than that of the hard mask layers 103a of the pattern isolated region I on a region of the same size. Therefore, the total region of the hard mask layers 103a exposed by the side wall of the opening 120a on the pattern dense region II is greater than that of the hard mask layers 103a exposed by the side wall of the opening 120a on the pattern dense region II. In the process of performing the oxidation treatment 300, in the case of the same amount of oxidizing gas on a region of the same size, compared with the pattern dense region II, the amount of the oxidizing gas for the oxidation treatment 300 on the side wall of the hard mask layer 103a of the pattern isolated region I per unit region is larger, and the oxidation rate of the hard mask layer 103a on the pattern isolated region I is higher. Therefore, after forming the trimming layer 104a, the thickness of the trimming layer 104a of the pattern isolated region I is greater than that of the trimming layer 104a of the pattern dense region II. Correspondingly, after the trimming layer 104a is formed, the width dimension difference between the openings 120a of the pattern isolated region I and the pattern dense region II is reduced.

In some implementations, the material of the hard mask layer 103a is silicon nitride. Correspondingly, the material of the trimming layer 104a is silicon oxynitride. In other implementations, when the material of the hard mask layer is boron nitride, titanium nitride or tantalum nitride, the material of the trimming layer is correspondingly boron oxynitride, titanium oxynitride or tantalum oxynitride.

In some implementations, the oxidation treatment 300 is performed by plasma oxidation treatment of the hard mask layer 103a exposed by the side wall of the opening 120a. The plasma oxidation treatment is advantageous for accurately controlling the consumption of the hard mask layer 103a, and is correspondingly advantageous for accurately controlling the thickness difference between the trimming layers 104a formed on the pattern isolated region I and the pattern dense region II.

Specifically, oxidizing gas for the plasma oxidation treatment includes one or more of $O_2$, $SO_2$, CO, $CO_2$, and COS, and carrier gas includes one or both of argon gas and helium gas.

A gas flow rate of the plasma oxidation treatment should not be too small, and should not be too large. If the gas flow rate is too small, it is prone to reduce the oxidation rate, thereby reducing the process manufacturing efficiency. If the gas flow rate is too large, it is prone to reduce the stability of the oxidation treatment 300, and increase the probability of influence of the oxidation treatment 300 on other film structures. To this end, in some implementations, in the step of plasma oxidation treatment, the oxidizing gas includes $O_2$, $O_2$ having a gas flow rate of 10 sccm to 500 sccm; and the carrier gas includes argon gas and helium gas, the argon gas having a gas flow rate of 100 sccm to 500 sccm, and the helium gas having a gas flow rate of 100 sccm to 500 sccm.

Correspondingly, in order to ensure that the plasma density of the plasma oxidation treatment is within a preset range, a source power of the plasma oxidation treatment is in a range of 100 to 1,000 W.

A process time of the plasma oxidation treatment should not be too short, and should not be too long. If the process time is too short, it is prone to make the effect of reducing the thickness difference between the trimming layers 104a of the pattern isolated region I and the pattern dense region II is not significant, thereby reducing the effect of the trimming layers 104 for compensating the lateral etching quantity difference of the base 100 corresponding to the pattern isolated region I and the pattern dense region II. If the process time is too long, it is prone to increase the process risk, the compensation excess may easily occur, that is, the width of the target pattern layer of the pattern isolated region I may be too large subsequently, which may also reduce the width dimension uniformity of the target pattern layer. To this end, in some implementations, the process time of the plasma oxidation treatment is in a range of 10 S to 600 S.

In addition, a process pressure of the plasma oxidation treatment is in a range of 5 mtorr to 5000 mtorr, so that it can be matched with process parameters such as the gas flow rate, the source power and the process time of the plasma oxidation treatment, thereby improving the process manufacturing efficiency and reducing side effects while making the thickness difference between the trimming layers 104a of each region meet process requirements.

In other implementations, after the trimming layers are formed, the trimming layer of the pattern dense region may be removed.

The subsequent steps are the same as those of the foregoing embodiment, and details are not described herein again.

Correspondingly, the present disclosure also provides a semiconductor structure. FIG. 6 schematically shows a structure diagram of a semiconductor structure according to an embodiment of the present disclosure.

The semiconductor structure includes: a base 100, the base 100 including a pattern dense region II and a pattern isolated region I; hard mask layers 103, separately provided on the base 100, the adjacent hard mask layers 103 and the base 100 defining an opening 120 (as shown in FIG. 5), and the opening 120 of the pattern isolated region I being wider than the opening 120 of the pattern dense region II; and a trimming layer 104, at least located on a side wall of the opening 120 of the pattern isolated region I, the trimming layer 104 and the hard mask layer 103 constituting a mask structure layer 110.

The subsequent procedure further includes: etching, by using the mask structure layer 110 as a mask, a portion of the thickness of the base 100 exposed by the opening 120 to form a plurality of target pattern layers protruding from the remaining base 100. As the opening is wider, the lateral etching of the base is more severe, and the formed target pattern layer is narrower. By means of the trimming layer 104, the width of the opening 120 of the pattern isolated region I is reduced, thus reducing a width dimension difference between the openings 120 of the pattern isolated region I and the pattern dense region II. In the step of subsequently etching a portion of the thickness of the base 100 exposed by the opening 120, the trimming layer 104 can compensate a difference of lateral etching quantities of the base 100 corresponding to the pattern isolated region I and the pattern dense region II. Correspondingly, after forming a plurality of target pattern layers protruding from the remaining base 100, the critical dimension uniformity of the target pattern layer in each region is improved.

The base 100 is used to provide a process platform for forming the semiconductor structure, and the base 100 is patterned subsequently to form a protruding target pattern layer on the remaining base 100.

In some implementations, the base 100 includes a pattern dense region II and a pattern isolated region I, and after forming a plurality of target pattern layers protruding from the remaining base 100 subsequently, the number of target pattern layers of the pattern dense region II is greater than the number of target pattern layers of the pattern isolated region I on the remaining base 100 per unit region.

In some implementations, the base 100 is used to form a substrate and a fin protruding from the substrate.

In some implementations, the material of the base 100 is silicon. In some other implementations, the material of the base may also be other materials such as germanium, silicon germanide, silicon carbide, gallium arsenide or indium gallide, and the base may also be other types of bases such as a silicon base on an insulator or a germanium base on an insulator. In still other implementations, the base may further include a first semiconductor layer and a second semiconductor layer epitaxially grown on the first semiconductor layer, the first semiconductor layer being used to provide a process basis for subsequently forming a substrate, and the second semiconductor layer being used to provide a process basis for subsequently forming a fin. In other implementations, the base may also be another functional layer to be etched, such as a gate material layer.

In some implementations, the semiconductor structure further includes: a polishing stop material layer 101, located between the mask structure layer 110 and the base 100 and on the base 100 exposed by the mask structure layer 110; and a pattern transfer material layer 102, located on the polishing stop material layer 101.

The polishing stop material layer 101 is used to subsequently form a polishing stop layer.

In some implementations, the base 100 is used to form a substrate and a fin protruding from the substrate. After subsequently forming the substrate and the fin, the method generally further includes a step of forming an isolation material layer on the substrate exposed by the fin. The polishing stop layer is used to define a stop position of planarization in the step of planarization for forming the isolation material layer, so as to improve the top height consistency of the isolation material layer and the loss of the fin by the planarization.

The polishing stop material layer 101 is further used to protect the top of the base 100 during the subsequent process procedure.

In some implementations, the material of the polishing stop material layer 101 is silicon nitride. The hardness and density of the silicon nitride material are both large, so that the effect of the polishing stop layer for defining the stop position of subsequent planarization can be ensured.

The pattern transfer material layer 102 is a material to be patterned.

A pattern in the mask structure layer 110 is subsequently transferred into the pattern transfer material layer 102 to form a pattern transfer layer, thereby subsequently etching the base 100 by using the pattern transfer layer as a mask, and providing a process basis for subsequently patterning the base 100.

Moreover, compared with the scheme of subsequently and directly etching the base by using the mask structure layer as a mask, the pattern transfer layer has a single layer structure, and the mask transfer layer has a good mask effect. Therefore, etching the base 100 by using the pattern transfer layer as a mask is advantageous for improving the process stability and process effect of the subsequent patterning process, thereby improving the pattern precision of the target pattern layer. For example, the line edge roughness and the line width roughness are improved.

In some implementations, the material of the pattern transfer material layer 102 is silicon oxide.

The trimming layer 104 and the hard mask layer 103 constitute a mask structure layer 110, the mask structure layer 110 being used as an etching mask for subsequently patterning the base 100.

In some implementations, the mask structure layer 110 is used to form a substrate and a fin protruding from the substrate, and the mask structure layer 110 is used to define the position and dimension of the fin.

The hard mask layer 103 is used as a portion of a mask for subsequently patterning the base 100, and the hard mask layer 103 is further used to provide a process platform for forming the trimming layer 104. Specifically, the hard mask layer 103 is located on the pattern transfer material layer 102.

In order to enable the hard mask layer 103 to function as a mask in the step of subsequently patterning the base 100, the material of the hard mask layer 103 is material having a larger etching selection ratio than the material of the base 100. In some implementations, the material of the hard mask layer 103 is silicon nitride.

In other implementations, the material of the hard mask layer may be another material having a larger etching selection ratio than the material of the base, depending on the material of the base and actual process requirements.

The hard mask layers 103 are separately provided on the base 100. Specifically, the hard mask layers 103 of various regions have the same width, the number of the hard mask layers 103 on the pattern isolated region I is less than that of the hard mask layers 103 on the pattern dense region II on the base 100 per unit region, and a space between the adjacent hard mask layers 103 on the pattern isolated region I is larger than a space between the adjacent hard mask layers 103 on the pattern dense region II. Therefore, the opening 120 of the pattern isolated region I is wider than the opening 120 of the pattern dense region II.

In some implementations, the material of the trimming layer 104 is a silicon-containing oxide layer. The silicon-containing oxide layer is a mask material (for example, silicon oxide, silicon oxynitride, etc.) commonly used in a semiconductor process, which is advantageous for improving process compatibility, and process stability and process effects of subsequent patterning processes, and is prone to remove silicon-containing oxide layers. Specifically, the material of the trimming layer 104 is silicon oxide. The silicon oxide is a commonly used material for the semiconductor process, which is advantageous for improving the process compatibility and reducing the process cost.

In other implementations, the material of the trimming layer may also be a carbon-containing polymer, depending on the type of plasma that actually forms the trimming layer.

In some other implementations, the trimming layer may also be obtained by consuming a portion of the thickness of the hard mask layer by oxidizing the hard mask layer. Correspondingly, when the material of the trimming layer is silicon nitride, the material of the trimming layer is silicon oxynitride. When the material of the trimming layer is boron nitride, titanium nitride or tantalum nitride, the material of the trimming layer is correspondingly boron oxynitride, titanium oxynitride or tantalum oxynitride.

In some implementations, the trimming layers 104 are located on the side walls of the openings 120 of the pattern isolated region I and the pattern dense region II, and the thickness of the trimming layer 104 of the pattern isolated region I is greater than that of the trimming layer 104 of the pattern dense region II in a direction perpendicular to the side walls of the openings 120.

In some implementations, a dimensional difference between the openings 120 of the pattern isolated region I and the pattern dense region II is small. In the step of subsequently patterning the base 100, a lateral etching quantity difference of the base 100 corresponding to the pattern isolated region I and the pattern dense region II is also small. Therefore, the trimming layers 104 are located on the side walls of the openings 120 of the pattern isolated region I and the pattern dense region II, which is advantageous for preventing the trimming layers 104 from excessively compensating the subsequent lateral etching quantity difference of the base 100 corresponding to the pattern isolated region I and the pattern dense region II.

Specifically, since the trimming layers 104 of the pattern isolated region I and the pattern dense region II have different thickness. In the step of subsequently patterning the base 100, a thickness difference between the trimming layers 104 of the pattern isolated region I and the pattern dense region II is used to compensate the lateral etching quantity difference of the base 100 corresponding to the pattern isolated region I and the pattern dense region II, and the width dimension uniformity of a target pattern layer can be improved correspondingly.

Moreover, the trimming layers 104 of the pattern isolated region I and the pattern dense region II are usually formed in the same step. By providing the trimming layers 104 on the side walls of the openings 120 of the pattern isolated region I and the pattern dense region II, the width dimension uniformity of a target pattern layer is improved while the step of removing the trimming layer 104 of the pattern dense region II is removed correspondingly, thereby simplifying the process steps.

A thickness difference between the trimming layer 104 of the pattern isolated region I and the trimming layer 104 of the pattern dense region II should not be too small, and should not be too large. If the thickness difference is too small, the effect of the trimming layers 104 for compensating the lateral etching quantity difference of the base 100 corresponding to the pattern isolated region I and the pattern dense region II is not significant. If the thickness difference is too large, the compensation excess may easily occur, that is, the width of the target pattern layer of the pattern isolated region I may be too large subsequently, which may also reduce the width dimension uniformity of the target pattern layer in each region. To this end, in some implementations, the thickness difference between the trimming layer 104 of the pattern isolated region I and the trimming layer 104 of the pattern dense region II is in a range of 0.5 nm to 3 nm.

It is to be noted that in the actual manufacturing process, according to the difference between width dimensions of the openings 120 of the pattern isolated region I and the pattern dense region II, and actual process conditions (for example, setting of etching process parameters), the thickness difference between the trimming layer 104 of the pattern isolated region I and the trimming layer 104 of the pattern dense region II may be reasonably adjusted.

In other implementations, the trimming layer may also be located only on the side wall of the opening of the pattern isolated region, depending on the width dimension difference of the opening of each region, and actual process conditions. For example, when the dimension difference of the openings of the pattern isolated region and the pattern dense region is large, the trimming layer may be located only on the side wall of the opening of the pattern isolated region, and can subsequently compensate the lateral etching quantity difference of the base corresponding to the pattern isolated region.

The semiconductor structure may be formed by the formation method described in the foregoing embodiments, or may be formed by other formation methods. For a detailed description of the semiconductor structure in some implementations, reference may be made to the corresponding description in the foregoing embodiments, and details are not described herein again.

Although the present disclosure has been disclosed above, the present disclosure is not limited thereto. Any changes and modifications may be made by those skilled in the art without departing from the spirit and scope of the present disclosure, and the scope of the present disclosure should be determined by the scope defined by the claims.

What is claimed is:

1. A method for forming a semiconductor structure, comprising:
   providing a base, the base comprising a pattern dense region and a pattern isolated region;
   forming a plurality of separate hard mask layers on the base, wherein adjacent hard mask layers and the base define openings, and wherein an opening of the pattern isolated region is wider than an opening of the pattern dense region;
   forming a trimming layer on side walls of the openings of the pattern isolated region and the pattern dense region, the trimming layer and the hard mask layers constituting a mask structure layer, a thickness of the trimming layer on a side wall of the opening of the pattern isolated region is greater than that of the trimming layer on a side wall of the opening of the pattern dense region in a direction perpendicular to the side walls of the openings; and
   etching, using the mask structure layer as a mask, a portion of a thickness of the base exposed by the openings to form a plurality of target pattern layers protruding from the remaining base.

2. The method for forming the semiconductor structure according to claim 1, wherein the method further comprises:
   before forming the trimming layer, performing at least one pre-etch pretreatment, and
   the step of pre-etch pretreatment comprises:
      performing plasma pretreatment,
      forming a trimming material layer on a bottom and the side walls of the openings and a top of the hard mask layers, and
      removing the trimming material layer on the bottom of the openings and the top of the hard mask layers,
      wherein a thickness of a remaining trimming material layer on the side wall of the opening of the pattern isolated region is greater than that of a remaining trimming material layer on the side wall of the opening of the pattern dense region in a direction perpendicular to the side walls of the openings.

3. The method for forming the semiconductor structure according to claim 1, wherein the step of forming the trimming layer comprises:
   oxidizing the hard mask layers exposed by the side walls of the openings of the pattern isolated region and the pattern dense region, and
   forming the trimming layer on the side walls of the remaining hard mask layers, where the thickness of the trimming layer of the pattern isolated region is greater than that of the trimming layer of the pattern dense region in a direction perpendicular to the side walls of the openings.

4. The method for forming the semiconductor structure according to claim 2, wherein the method further comprises:
   before etching, using the mask structure layer as a mask, a portion of the thickness of the base exposed by the openings, removing the trimming layer of the pattern dense region.

5. The method for forming the semiconductor structure according to claim 2, wherein parameters of the plasma pretreatment comprise:
   reaction gas comprises $SiCl_4$, $CH_4$, $CH_3F$ or $CH_2F_2$ gas, where $SiCl_4$ has a gas flow rate of 5 sccm to 500 sccm, or $CH_4$ has a gas flow rate of 5 sccm to 500 sccm, or $CH_3F$ has a gas flow rate of 5 sccm to 500 sccm, or $CH_2F_2$ has a gas flow rate of 5 sccm to 500 sccm, and a source power is in a range of 100 W to 1,000 W, and a process pressure is in a range of 5 mtorr to 200 mtorr.

6. The method for forming the semiconductor structure according to claim 2, wherein the trimming material layer on the bottom of the openings and the top of the hard mask layers are removed by a plasma etching process.

7. The method for forming the semiconductor structure according to claim 6, wherein parameters of the plasma etching process comprise:
   etching gas comprises $CH_4$, $CH_3F$ and $NF_3$, where $CH_4$ has a gas flow rate of 5 sccm to 500 sccm, $CH_3F$ has a gas flow rate of 5 sccm to 500 sccm, $NF_3$ has a gas flow rate of 5 sccm to 500 sccm, a source power is in a range of 100 W to 1,000 W, a bias power is in a range of 50 W to 500 W, and a process pressure is in a range of 5 mtorr to 200 mtorr.

8. The method for forming the semiconductor structure according to claim 3, wherein the oxidation treatment is performed by plasma oxidation treatment of the hard mask layers exposed by the side walls of the openings.

9. The method for forming the semiconductor structure according to claim 8, wherein parameters of the plasma oxidation treatment comprise:
oxidizing gas comprises one or more of $O_2$, $SO_2$, CO, $CO_2$, and COS,
carrier gas comprises one or both of argon gas and helium gas,
where the oxidizing gas has a gas flow rate of 10 sccm to 500 sccm, the carrier gas has a gas flow rate of 100 sccm to 500 sccm, a source power is in a range of 100 W to 1,000 W, a process time is in a range of 10 S to 600 S, and a process pressure is in a range of 5 mtorr to 5,000 mtorr.

10. The method for forming the semiconductor structure according to claim 2, wherein in the step of forming the trimming layer, a thickness difference between the trimming layer of the pattern isolated region and the trimming layer of the pattern dense region is in a range of 0.5 nm to 3 nm.

11. The method for forming the semiconductor structure according to claim 2, wherein the material of the trimming layer is a silicon-containing oxide layer or a carbon-containing polymer.

12. The method for forming the semiconductor structure according to claim 3, wherein the material of the trimming layer is silicon oxynitride, boron oxynitride, titanium oxynitride or tantalum oxynitride.

13. The method for forming the semiconductor structure according to claim 1, wherein the portion of the thickness of the base exposed by the openings is etched by an etching process having a square wave pulse type bias voltage.

14. The method for forming the semiconductor structure according to claim 1, wherein after etching the portion of the thickness of the base exposed by the opening, the remaining base is used as a substrate, and the target pattern layers are fins.

* * * * *